United States Patent
Liu

(10) Patent No.: US 8,081,458 B2
(45) Date of Patent: Dec. 20, 2011

(54) HEAT DISSIPATION APPARATUS FOR ELECTRONIC DEVICE

(75) Inventor: Jian Liu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 136 days.

(21) Appl. No.: 12/764,053

(22) Filed: Apr. 20, 2010

(65) Prior Publication Data

US 2011/0141686 A1 Jun. 16, 2011

(30) Foreign Application Priority Data

Dec. 10, 2009 (CN) .......................... 2009 1 0311170

(51) Int. Cl.
*H05K 7/20* (2006.01)
(52) U.S. Cl. ....... 361/695; 361/690; 361/694; 165/80.4; 165/122; 174/16.1; 174/16.3
(58) Field of Classification Search .................. None
See application file for complete search history.

(56) References Cited

U.S. PATENT DOCUMENTS

| | | | | |
|---|---|---|---|---|
| 7,251,136 B2 * | 7/2007 | Yang et al. | .................... | 361/695 |
| 7,256,997 B2 * | 8/2007 | Chen et al. | .................... | 361/697 |
| 7,277,281 B1 * | 10/2007 | Lu et al. | ........................ | 361/695 |
| 7,428,153 B2 * | 9/2008 | Tan et al. | ...................... | 361/700 |
| 7,471,513 B2 * | 12/2008 | Hayashi | ........................ | 361/695 |
| 7,495,912 B2 * | 2/2009 | Long et al. | .................... | 361/697 |
| 7,729,119 B2 * | 6/2010 | Yang | ............................ | 361/700 |
| 7,967,059 B2 * | 6/2011 | Li et al. | ........................ | 165/80.3 |
| 2007/0091566 A1 * | 4/2007 | Sun | ............................... | 361/695 |

* cited by examiner

*Primary Examiner* — Boris Chervinsky
(74) *Attorney, Agent, or Firm* — Altis Law Group, Inc.

(57) ABSTRACT

A heat dissipation apparatus adapted for simultaneously cooling a first electronic component and a second electronic component includes a heat sink adapted for being thermally attached to the first electronic component, a fan duct receiving the heat sink therein and a fan mounted to the fan duct. The fan duct comprises a top plate and two side plates extending from two opposite sides of the top plate. A receiving space is defined in the fan duct between the top plate and a top of the heat sink and adapted for receiving the second electronic component. Airflow from the fan is guided by the fan duct to blow towards the heat sink and the second electronic component, simultaneously.

14 Claims, 2 Drawing Sheets

HEAT DISSIPATION APPARATUS FOR ELECTRONIC DEVICE

BACKGROUND

1. Technical Field

The disclosure relates to heat dissipation apparatuses, and particularly to a heat dissipation apparatus for use in an electronic device.

2. Description of Related Art

Nowadays, with the development of electronic technology, an electronic device such as a computer or a server is devised to be much thinner and smaller than before, yet hold many more electronic modules. However, the electronic modules generate a large amount of heat during operation. The interior space of the electronic device is very limited, and the electronic modules occupy much of that space. This is liable to result in heat generated by the electronic modules accumulating rather than being dissipated in a timely manner.

In a typical personal computer or server, there are various heat sources, such as the central processing unit (CPU) and the hard disk drive (HDD). Generally, a first heat dissipation apparatus is provided for cooling a first heat source, such as the CPU, and a second separate heat dissipation apparatus is provided for cooling a second heat source, such as the HDD. However, the first and second heat dissipation apparatuses together occupy much of the very limited interior space of the electronic device.

What is needed, therefore, is a heat dissipation apparatus for an electronic device which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
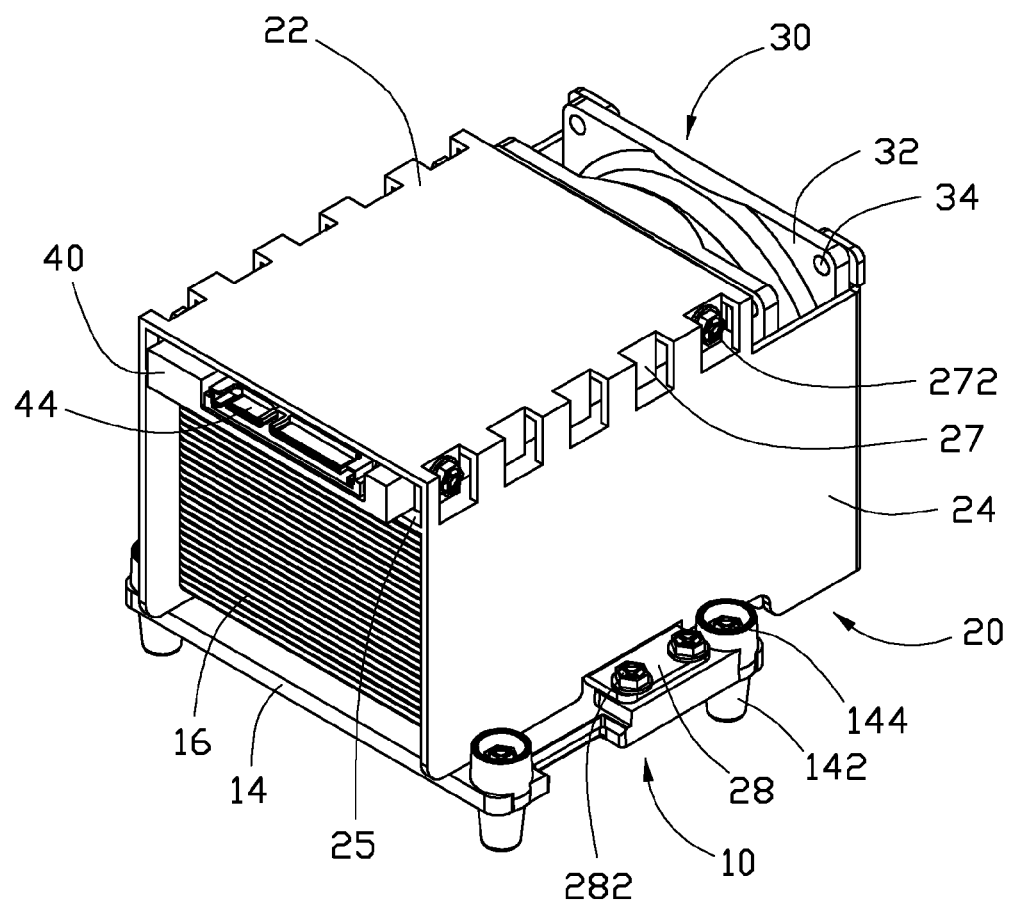
FIG. 1 is an isometric, assembled view of a heat dissipation apparatus in accordance with an embodiment of the disclosure.
Figure 2:
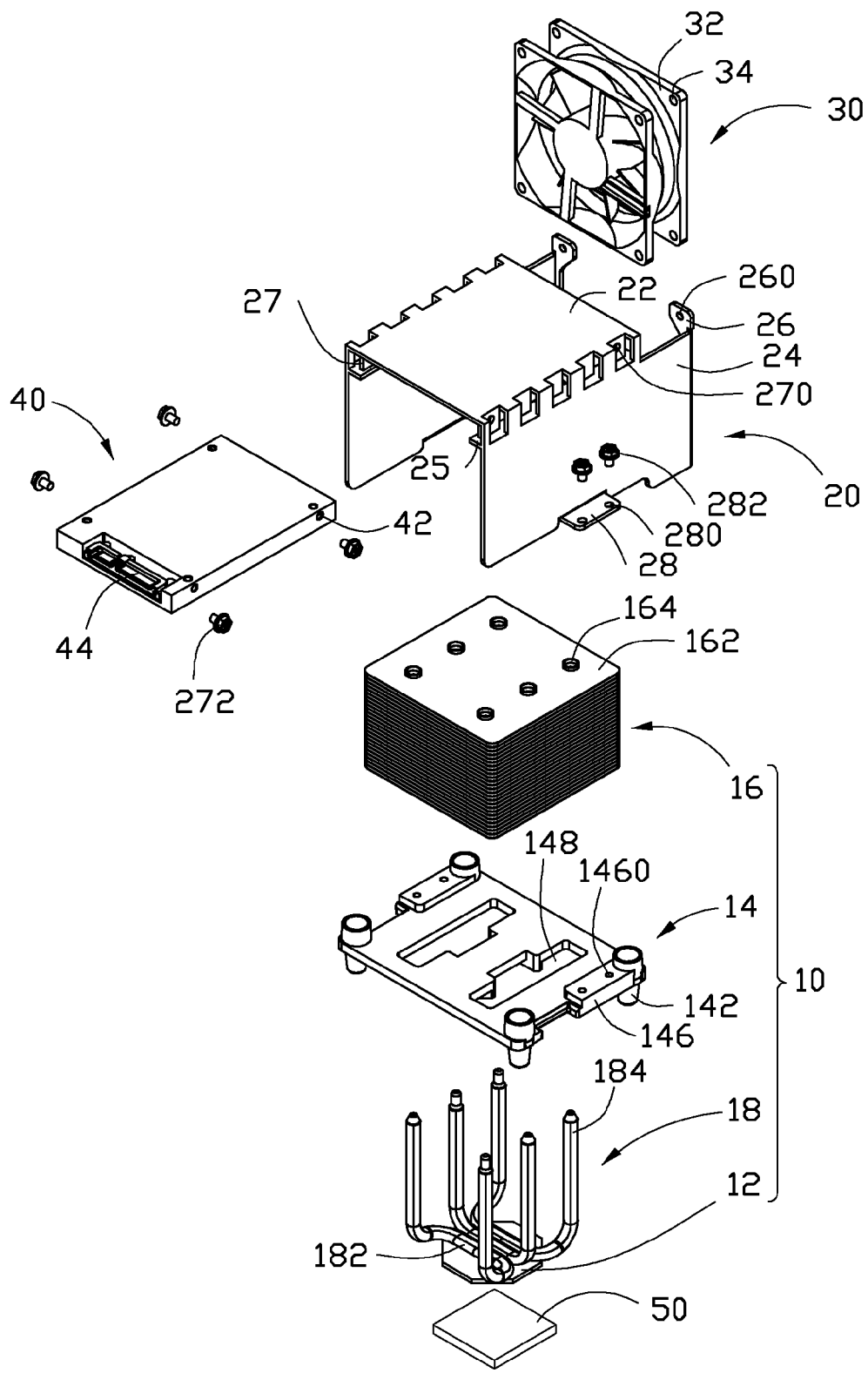
FIG. 2 is an exploded view of the heat dissipation apparatus of FIG. 1.

Referring to FIGS. 1-2, a heat dissipation apparatus in accordance with an embodiment of the disclosure is used for simultaneously cooling a first heat-generating electronic component and a second heat-generating electronic component. In the embodiment of the disclosure, the first electronic component is a CPU (central processing unit) 50 mounted on a printed circuit board (not shown), and the second electronic component is a hard disk drive 40. The hard disk drive 40 has a data port 44 at a front end thereof for connecting with data lines. Two fixing holes 42 are defined in each of two opposite lateral sides of the hard disk drive 40. The heat dissipation apparatus includes a heat sink 10, a fan duct 20 covering the heat sink 10, and a fan 30 mounted at one end of the fan duct 20. The hard disk drive 40 is mounted in the fan duct 20 and located above the heat sink 10.

The heat sink 10 includes a heat spreader 12 thermally contacting the CPU 50, a mounting base 14 mounted at a top of the heat spreader 12, a fin assembly 16 mounted at a top of the mounting base 14, and three heat pipes 18 thermally attaching to the heat spreader 12, the mounting base 14 and the fin assembly 16.

The mounting base 14 is integrally made of metal such as aluminum, copper or an alloy thereof, and is generally rectangular in shape. Four sleeves 142 are formed at the four corners of the mounting base 14. Four fasteners 144 extend through the sleeves 142 of the mounting base 14 and the printed circuit board to mount the heat dissipation apparatus on the printed circuit board, whereby the heat spreader 12 is brought into intimate contact with the CPU 50. Two mounting portions 146 are formed on two opposite lateral sides of the mounting base 14. Two mounting holes 1460 are defined in each mounting portion 146. Two through slots 148 are defined in a center of the mounting base 14.

The fin assembly 16 includes a plurality of fins 162 stacked together. The fins 162 each are made of metal such as aluminum, copper or an alloy thereof. The fins 162 are spaced from each other to thereby form a plurality of airflow passages (not labeled) therebetween. The fin assembly 16 defines six through holes 164 through the fins 162.

Each heat pipe 18 is generally U-shaped, and includes an evaporating section 182 and two condensing sections 184 extending upwardly from two ends of the evaporating section 182. The evaporating section 182 is sandwiched between the heat spreader 12 and the mounting base 14. The condensing sections 184 extend through the through slots 148 of the mounting base 14 and are received in the through holes 164 of the fin assembly 16.

The fan 30 has a height equal to that of the fan duct 20. The fan 30 has a flange 32 defining four through holes 34 at four corners thereof.

The fan duct 20 is integrally made of a material such as plastic. The fan duct 20 has a U-shaped cross section, and includes a top plate 22 and two side plates 24 extending vertically and downwardly from two opposite sides of the top plate 22. The distance between the two side plates 24 of the fan duct 20 is slightly larger than the width of the hard disk drive 40. The length of the top plate 22 is smaller than that of each side plate 24. Two fixing portions 26 extend vertically and inwardly from rear ends of the two side plates 24, respectively. Two fixing holes 260 are defined in the fixing portions 26, corresponding to the through holes 34 of the fan 30. A mounting portion 28 extends horizontally and outwardly from a bottom of each side plate 24, corresponding to the mounting portion 146 of the base 14. Each mounting portion 28 of the fan duct 20 defines two mounting holes 280, corresponding to the mounting holes 1460 of the mounting portion 146 of the mounting base 14. Two holding plates 25 extend horizontally and inwardly from insides of the two side plates 24 near the top plate 22, for supporting the hard disk drive 40 thereon. The length of each holding plate 25 is equal to that of the top plate 22. The distance between each holding plate 25 and the top plate 22 is equal to the thickness of the hard disk drive 40. A plurality of spaced limiting portions 27 are formed on each side plate 24 between each holding plate 25 and the top plate 22. Thus, the top plate 22, the two holding plates 25 and the limiting portions 27 of the side plates 24 together form a receiving space (not labeled) for receiving the hard disk drive 40 therein. Two through holes 270 are defined in two frontmost limiting portions 27 located at the two opposite sides of the top plate 22, and another two through holes 270 are defined in two rearmost limiting portions 27 located at the two opposite sides of the top plate 22. The four limiting portions 27 correspond to the fixing holes 42 of the hard disk drive 40.

In assembly, the fan 30 is mounted to the fan duct 20 so that the through holes 34 of the fan 30 are in alignment with the fixing holes 260 of the fixing portions 26 of the fan duct 20. Screws (not shown) extend through the through holes 34 of the fan 30 and are screwed into the fixing holes 260 of the fixing portions 26 to mount the fan 30 to the rear end of the fan duct 20. The fan duct 20 is covered on the fin assembly 16 of the heat sink 10 so that the through holes 280 of the mounting portions 28 of the fan duct 20 are in alignment with the mounting holes 1460 of the mounting portions 146 of the mounting base 14. Screws 282 extend through the through holes 280 of the mounting portions 28 of the fan duct 20 and are screwed into the mounting holes 1460 of the mounting portions 146 of the mounting base 14 to mount the fan duct 20 on the mounting base 14. The hard disk drive 40 is pushed to enter into the receiving space of the fan duct 20 along the holding plates 25 of the fan duct 20 so that the fixing holes 42 of the hard disk drive 40 are in alignment with the through holes 270 of the limiting portions 27 of the fan duct 20. The data port 44 of the hard disk drive 40 is located at the front end of the fan duct 20 far away from the fan 30. Screws 272 extend through the through holes 270 of the limiting portions 27 and are screwed into the fixing holes 42 of the hard disk drive 40 to mount the hard disk drive 40 in the fan duct 20 between the top plate 22 and the holding plates 25 of the fan duct 20.

During operation of the heat dissipation apparatus, airflow from the fan 30 can be guided by the fan duct 20 to blow towards the heat sink 10 and the hard disk drive 40 in the fan duct 20, so that heat from the CPU 50 and heat from the hard disk drive 40 can be dissipated simultaneously by the single heat dissipation apparatus.

It is believed that the disclosure and its advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A heat dissipation apparatus adapted for simultaneously cooling a first electronic component and a second electronic component, the heat dissipation apparatus comprising:
    a heat sink adapted for being thermally attached to the first electronic component;
    a fan duct in which the heat sink is received, the fan duct comprising a top plate and two side plates extending from two opposite sides of the top plate, a receiving space defined in the fan duct between the top plate and a top of the heat sink and adapted for receiving the second electronic component; and
    a fan mounted to the fan duct, airflow from the fan being guided by the fan duct to blow towards the heat sink and the second electronic component simultaneously.

2. The heat dissipation apparatus of claim 1, wherein the first electronic component is a central processing unit (CPU), and the second electronic component is a hard disk drive.

3. The heat dissipation apparatus of claim 1, wherein two holding plates extend horizontally and inwardly from insides of the two side plates near the top plate, the second electronic component is sandwiched between the top plate and the holding plates, and the top plate, the two holding plates and the side plates together form the receiving space.

4. The heat dissipation apparatus of claim 3, wherein a plurality of limiting portions are formed on each side plate between each holding plate and the top plate, the limiting portions abut against the second electronic component.

5. The heat dissipation apparatus of claim 4, wherein a fixing hole is defined in each of two opposite lateral sides of the second electronic component, and a through hole is defined in one of the limiting portions corresponding to the fixing hole of the second electronic component.

6. The heat dissipation apparatus of claim 3, wherein two fixing portions are formed on one end of the fan duct, and the fan is fixed on the fixing portions of the fan duct.

7. The heat dissipation apparatus of claim 3, wherein a mounting portion extends horizontally and outwardly from a bottom of each side plate and is fastened to the heat sink.

8. An electronic device, comprising:
    a first electronic component;
    a second electronic component; and
    a heat dissipation apparatus for simultaneously cooling the first electronic component and the second electronic component, the heat dissipation apparatus comprising:
        a heat sink thermally attached to the first electronic component;
        a fan duct in which the heat sink is received, the fan duct comprising a top plate and two side plates extending from two opposite sides of the top plate, a receiving space defined in the fan duct between the top plate and a top of the heat sink, the second electronic component received in the receiving space; and
        a fan mounted to the fan duct, airflow from the fan being guided by the fan duct to blow towards the heat sink and the second electronic component simultaneously.

9. The electronic device of claim 8, wherein the first electronic component is a central processing unit (CPU), and the second electronic component is a hard disk drive.

10. The electronic device of claim 8, wherein two holding plates extend horizontally and inwardly from insides of the two side plates near the top plate, the second electronic component is sandwiched between the top plate and the holding plates, and the top plate, the two holding plates and the side plates together form the receiving space.

11. The electronic device of claim 10, wherein a plurality of limiting portions are formed on each side plate between each holding plate and the top plate, the limiting portions abut against the second electronic component.

12. The electronic device of claim 11, wherein a fixing hole is defined in each of two opposite lateral sides of the second electronic component, and a through hole is defined in one of the limiting portions corresponding to the fixing hole of the second electronic component.

13. The electronic device of claim 10, wherein two fixing portions are formed on one end of the fan duct, and the fan is fixed on the fixing portions of the fan duct.

14. The electronic device of claim 10, wherein a mounting portion extends horizontally and outwardly from a bottom of each side plate and is fastened to the heat sink.

* * * * *